United States Patent [19]

Huang et al.

[11] Patent Number: 4,988,638

[45] Date of Patent: Jan. 29, 1991

[54] METHOD OF FABRICATION A THIN FILM SOI CMOS DEVICE

[75] Inventors: Tiao-Yuan Huang; Anne Chiang, both of Cupertino; I-Wei Wu, San Jose, all of Calif.

[73] Assignee: Xerox Corporation, Stamford, Conn.

[21] Appl. No.: 546,288

[22] Filed: Jun. 29, 1990

Related U.S. Application Data

[62] Division of Ser. No. 268,832, Nov. 7, 1988, Pat. No. 4,951,113.

[51] Int. Cl.⁵ .................... H01L 21/86; H01L 21/70
[52] U.S. Cl. ........................ 437/57; 437/62;
437/21; 437/913; 437/34; 148/150
[58] Field of Search .............. 437/57, 40, 21, 84,
437/83; 148/150, 9, 8; 357/23.7

[56] References Cited

U.S. PATENT DOCUMENTS

| 4,002,501 | 1/1977 | Tamura | 437/21 |
| 4,277,883 | 7/1981 | Kaplan | 437/21 |
| 4,279,069 | 7/1981 | Beguwala et al. | 437/21 |
| 4,558,340 | 12/1985 | Schachter et al. | 357/23.7 |
| 4,761,679 | 8/1988 | Stupp | 357/23.7 |

FOREIGN PATENT DOCUMENTS 0075876 7/1978 Japan .................... 437/57

OTHER PUBLICATIONS

Silicon-on-Sapphire Complementary MOS Memory Cells; Allison et al., IEEE; Dec. 67.

Primary Examiner—Olik Chaudhuri
Assistant Examiner—Michael Trinh
Attorney, Agent, or Firm—Serge Abend

[57] ABSTRACT

A thin film SOI CMOS device wherein the suitably doped deposited layers of an n-channel transistor and a p-channel transistor are simultaneously deposited. The source and drain elements of one transistor and the gate element of the other transistor are formed in a lower, highly doped, semiconductor layer and are separated from the corresponding gate element and source and drain elements formed in an upper, highly doped, semiconductor layer. The layer levels are separated by two intrinsic or lightly doped semiconductor layers sandwiching a dielectric layer, so that the intrinsic or lightly doped semiconductor layer lying contiguous to the source and drain elements serves as an active channel layer and the intrinsic or lightly doped semiconductor layer lying contiguous to the gate element serves to extend the gate layer.

2 Claims, 6 Drawing Sheets

METHOD OF FABRICATION A THIN FILM SOI CMOS DEVICE

This is a division of application Ser. No. 07/268,832, filed Nov. 7, 1988, U.S. Pat. No. 4,951,113.

FIELD OF THE INVENTION

This invention relates to thin film CMOS transistors comprising deposited layers which are in-situ doped whth appropriate dopants. Our method of their fabrication includes the simultaneous deposition of the silicon based thin film layers of both the n-channel and p-channel devices upon an insulating substrate (SOI).

BACKGROUND OF THE INVENTION

In CMOS technology both p-and channel transistors are used. When an enhancement mode n-channel MOS transistor is connected in a series common-gate configuration with an enhancement mode p-channel MOS transistor, the resulting structure functions as a simple inverter and dissipates virtually no power whatsoever so long as the inverter is in one of its two stable states. In either of the two stable conditions, one of the transistors will be in a very high impedance OFF state, consequently, the series combination of the two devices will draw almost no steady-state current. Power will only be dissipated during switching from one state to the other. For this reason CMOS has become, in recent years, an important semiconductor technology which allows more circuits within the power constraints of a given package. Compared to bipolar or even NMOS, the greater number of circuits permitted within the package and the resulting reduction in package interfaces can be used by system architects to achieve better system performance. CMOS can also reduce system cost by eliminating the need for cooling fans and reducing the size of power supplies. The major shortcomings of this technology have been the more complex processing, the increased layout area requirement and the possibility of latchup.

In bulk CMOS both n-channel and p-channel transistors are typically formed, as shown in FIG. 1, and designated by the numerals 1 and 2, respectively. The n-type silicon wafer substrate 3, has a p-type well 4 therein, created by diffusion or ion implantation of dopant impurities. An n-channel transistor is created by ion implentation of an n+ source element 5 and an n+ drain element 6 within the p-well region, and deposition of a thin gate oxide layer 7 and a heavily-doped gate layer 8. The p-channel transistor is made by ion implantation of a p+ source 9 and a p+ drain 10 in the n-substrate and the deposition of a thin gate oxide layer 11 and a heavily-doped gate layer 12.

CMOS process technology is undergoing extensive experimentation in processing steps and parameters in order to provide a process architecture which is latch-up free and achieves a maximum layout density with a simple process comprising fewer low complexity processing steps. Today's drive toward smaller device geometries has exacerbated the latchup problem inherent in the bulk CMOS devices. During latchup, the presence of a four layer pnpn structure (elements 9/3/4/6 in FIG. 1), causes a near short circuit condition across the power supply. If current flow is not limited by external means, such as guard rings, some metal or diffusion current paths will blow open. Guard rings are low resistivity connections to supply voltages built around the CMOS p-channel and n-channel transistors. They have the effect of protecting against latch-up but reduce the gate density by requiring more space between the n-and p-channel transistors. Another alternative for reducing the latch-up phenomenon is to increase the distance between the p-well and p-diffusion, effectively increasing the width of the base region for pnp transistors. Here again, some area is wasted, reducing the gate density. In bulk CMOS the chance of latchup can be reduced only at the expense of silicon areas or the addition of a more expensive epitaxial layer.

The basic design challenge has been to fabricate both p-channel and n-channel transistors on the same wafer, to optimize their performance, and to maximize their density. One relatively simple approach has been SOS (silicon-on-sapphire) CMOS, illustrated in FIG. 2 in which the n-channel transistor 13 and the p-channel transistor 14 are formed on top of the substrate 15. The sapphire (aluminum oxide) wafer's crystal lattice is compatible with that of the silicon grown thereon. Rather than diffusing wells and n-and p-type regions within the substrate, a p-type silicon island 16 and an n-type silicon island 17 are patterned on top of the substrate and are then properly doped for transistor action. The p-type island 16 receives n-type dopant to form an n-channel device and the n-type island 17 receives p-type dopant to form a p-channel device. A gate oxide layer 18 and a suitably doped semiconductor gate layer 19 are deposited upon the islands. An advantage of this approach is the inherent isolation of the transistors and the possibility of increased device density by scaling. A disadvantage of the SOS process is that the dielectric constant of sapphire is high compared with that of silicon. This results in a higher coupling capacitance in the adjacent wires, which gets worse with scaling, and affects speed adversely.

In both of the above-described processes, doping is accomplished by ion implantation which, for all practical purposes, presents a size limitation for the substrate. This is because ion implantation equipment for large area (e.g. on the order of about $10 \times 12$ inches) processing is not commercially available today.

It is an object of the pressent invention to provide a thin film SOI CMOS device wherein the suitably doped deposited layers of an n-channel transistor and its complementary p-channel transistor are simultaneously deposited.

It is alto an sbject of our invention to provide a simplified process for fabricating CMOS devices on large area substrates with simultaneously diposited source and drain layers which are in-situ doped with appropriate dopants.

It is another object of our invention to provide a simplified process for fabricating a thin film SOI CMOS device wherein the p- and n-channel transistors are inherently isolated so as to eliminate latch-up, and scaling can be achieved for maximizing device density.

It is a further object of our invention to provide a self-aligned thin film SOI CMOS device.

SUMMARY OF THE INVENTION

These objects may be achieved, in one form, by providing a thin film SOI CMOS device including complementary transistors isolated from one another and supported upon an insulating substrate wherein the suitably doped deposited layers of an n-channel transistor and a p-channel transistor are simultaneously deposited. The source and drain elements of one transistor and the gate element of its complementary transistor are formed of a first doped semiconductor material, of one conductivity type, and are disposed at a first level upon a substrate. The gate element of the one transistor and the source and drain elements of the complementary transistor are formed of a second doped semiconductor material, of the opposite conductivity type, and disposed at a second level above the substrate. The elements of the first doped semiconductor material and the elements of the second doped semiconductor material are separated by and contiguous to a tri-layer stack including a pair of intrinsic or lightly doped semiconductor layers separated by a dielectric layer, wherein the intrinsic or lightly doped layer contiguous to the source and drain elements is the active channel layer for its transistor. A method for fabricating the thin film SOI CMOS device is also provided for the in situ deposition of the doped layers.

DETAILED DESCRIPTION OF THE DRAWINGS

One form of the process for fabricating our SOI CMOS device will now be described with reference to FIG. 3 It should be noted, that in the interest of brevity, several steps are grouped together and shown and described with regard to a single illustration.

Figure 1:
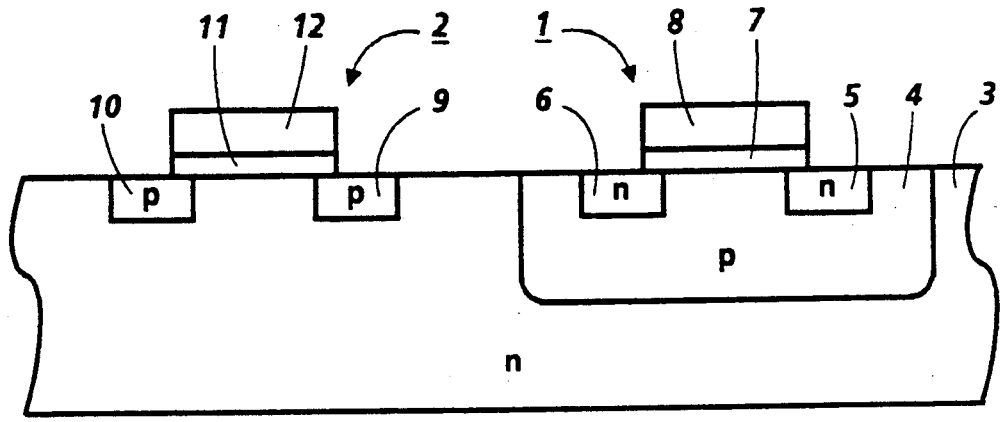
FIG. 1 is a schematic side elevation view of a conventional bulk CMOS device.
Figure 2:
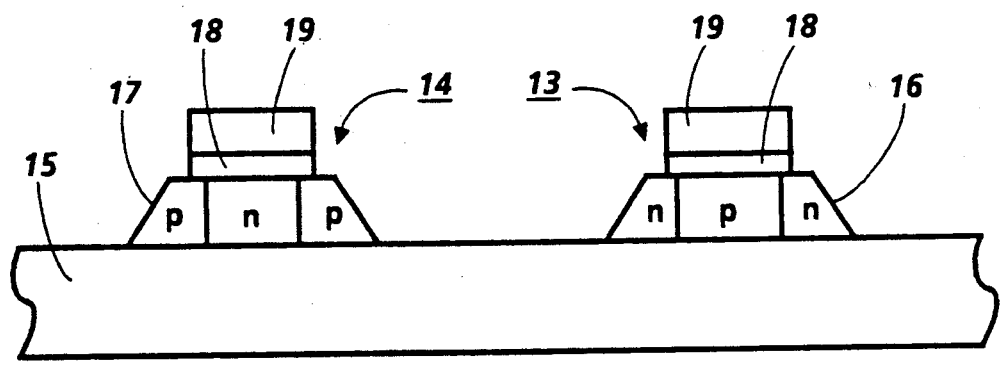
FIG. 2 is a schematic side elevation view of a conventional SOS CMOS device.
Figure 3A:
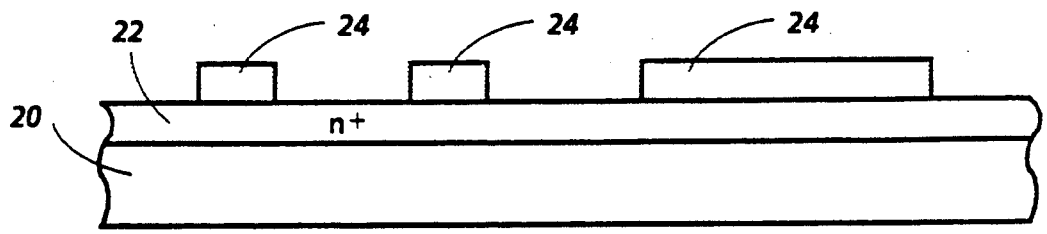
FIGS. 3a through 3f are cross sections, not to scale, of our SOI CMOS device during the steps of its fabrication according to one process of the present invention.

FIG. 3a: First an insulating substrate 20 (e.g.,quartz or oxidized silicon) is provided, upon which is supported an in situ doped n+ (p+ can be used equally well as the first layer) layer 22 of an amorphous or polycrystalline semiconductor, such as silicon, on top of which is a patterned photoresist 24 layer. The photoresist layer has been patterned by a first device feature mask, in a known manner.

Figure 3B:
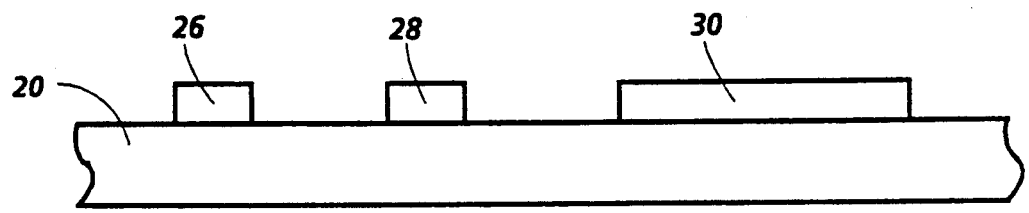

FIG. 3b: Then the n+ layer 22 is etched and the photoresist is removed to form simultaneously an n+ source 26, an n+ drain 28 and an n+ gate 30. As will be seen, an n-channel transistor will incorporate the source and drain elements and a p-channel transistor will incorporate the gate element.

Figure 3C:
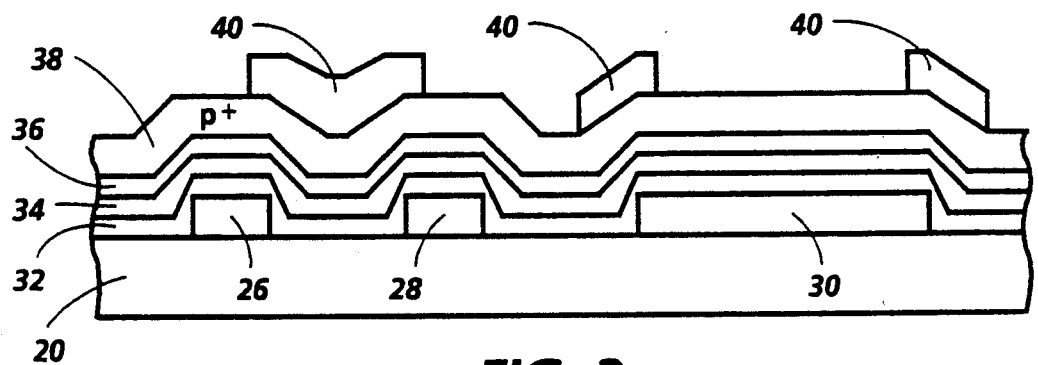

FIG. 3c: In the next series of steps, a stack of four layers 32/34/36/38 is deposited sequentially, followed by deposition and patterning of a photoresist layer 40. The four layers may be deposited upon the substrate in a single pump down cycle, ensuring that there will be absolutely no contaminants between them. Layer 32 comprises undoped or lightly doped amorphous or polycrystalline silicon; layer 34 comprises a thin gate dielectric material, such as a low temperature oxide, which may be deposited or may be thermally grown; layer 36 again comprises undoped or lightly doped amorphous or polycrystalline silicon; and layer 38 comprises p+ (n+ if the layer 22 was p+) amorphous or polycrystalline silicon. The photoresist layer 40 has been patterned by a second device feature mask. Each of the layers 32, 34 and 36 will be about 10 to 200 nm thick and the bottom and top heavily doped layers will be about 50 to 400 nm thick.

Figure 3D:
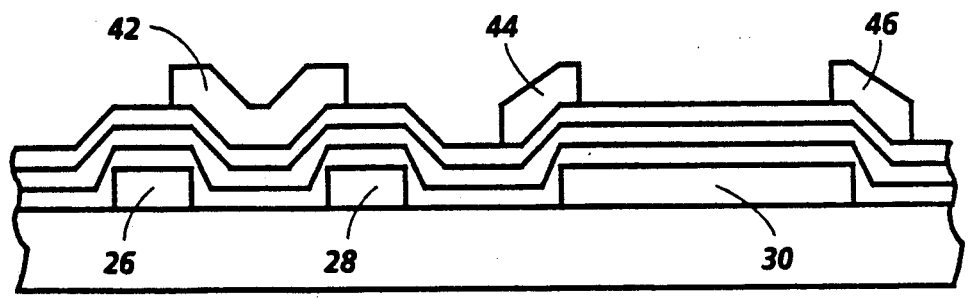

FIG. 3d: The p+ layer 38 has been etched and the photoresist has been removed, simultaneously leaving a p+ gate 42 overlying the n+ source and drain 26/28, and a p+ source 44 and a p+ drain 46 overlying the n+ gate 30.

Figure 3E:
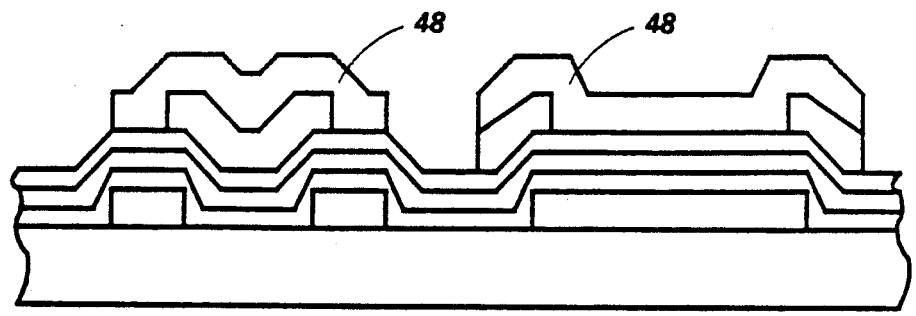

FIG. 3e: A second patterned photoresist 48 has been deposited and patterned with an island mask.

Figure 3F:
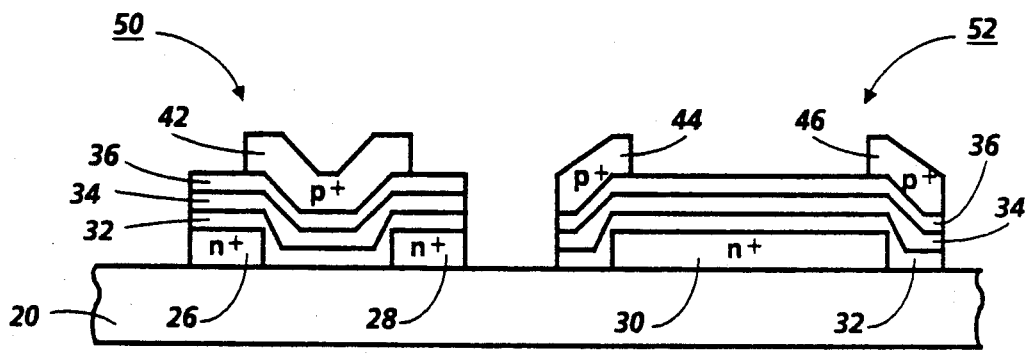

FIG. 3f: Finally the trilayer stack 32, 34, 36 is completely etched through to the substrate 20 in order to isolate the n-channel device 50 from the p-channel device 52, and the photoresist is removed.

We have found that this sequence of processing steps is advantageous because the four layer stack (32, 34, 36 and 38) may be deposited sequentially without removing the substrate from the deposition chamber, thus insuring that the intrinsic/p+ layer (36/38) interface is clean and entirely without contaminants. On the other hand, there is no on wafer end point detection for defining the p+ layer 38 into the gate 42, source 44 and drain 46 features and, since the intrinsic layer 36 is very thin, some etching and further thinning thereof may take place, even with a differential etchant.

Since on-wafer end poing detection is a distinct advantage, we provide the following sequence of steps with reference to FIG. 4. The initial steps of this fabrication process are the same as described and illustrated in FIGS 3a and 3b.

Figure 4A:
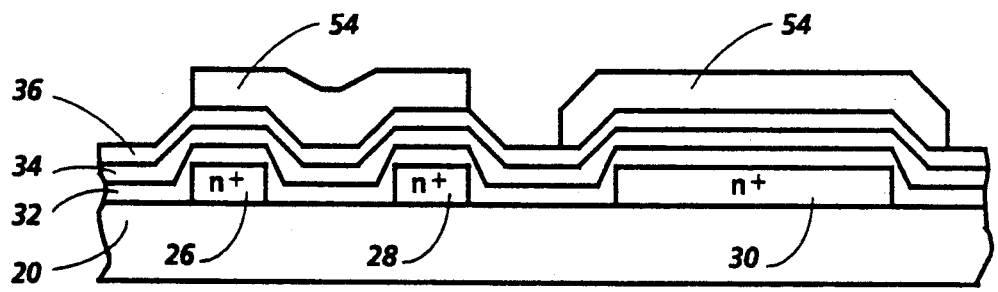
FIGS. 4a through 4e are cross sections, not to scale, of our SOI CMOS device during the steps of another process of fabricating our invention.

FIG. 4a: Then the tri-layer stack 32/34/36 comprising the same materials and layer thicknesses as described with reference to FIG 3c is deposited, followed by deposition of a patterned photoresist layer 54, patterned with an island mask.

Figure 4B:
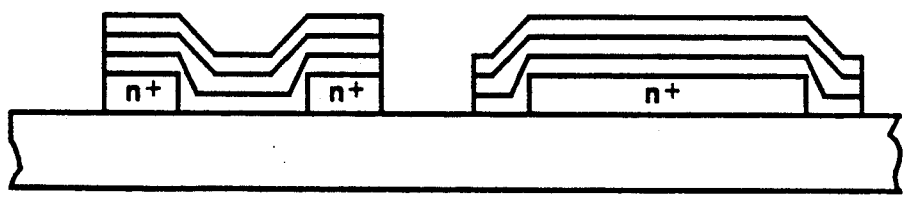

FIG. 4b: The tri-layer stack is then etched through to the substrate 20 to isolate the devices and the photresist has been removed.

Figure 4C:
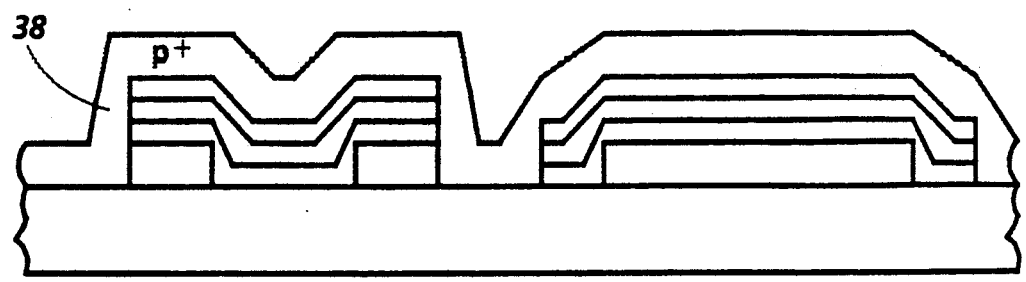

FIG. 4c: A p+ layer 38 is deposited over the wafer.

Figure 4D:
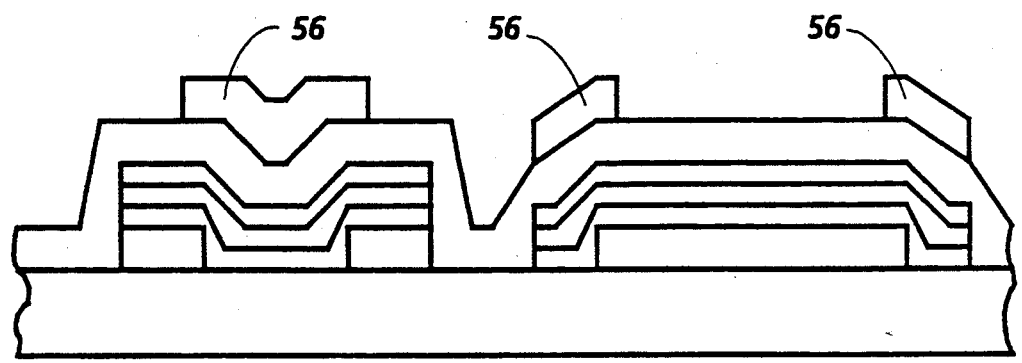

FIG. 4d: A patterned photoresist layer 56 has been defined with a second feature mask.

Figure 4E:
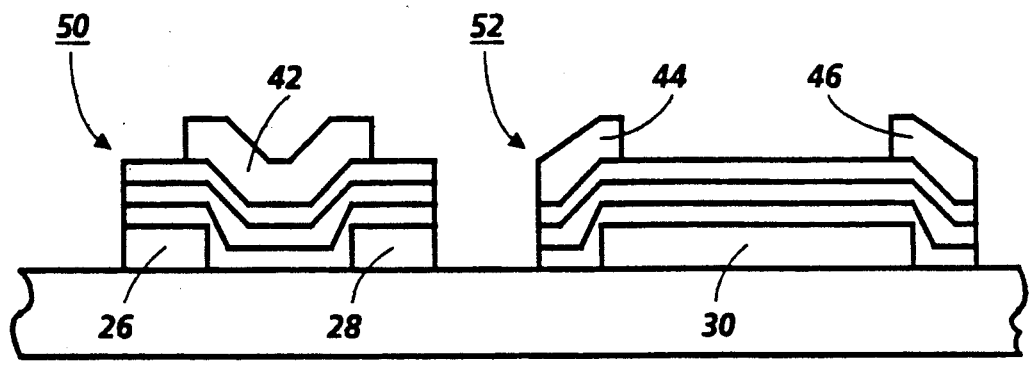

FIG. 4e: Finally, the p+ layer 38 is etched away and the photoresist removed, to form the p+ gate 42 of the n-channel device 50, and the p+ source 44 and p+ drain 46 of the p-channel device 52. This processing sequence is advantageous because it includes on-wafer end point detection for etching the p+ layer 38. When etched to completion, the p+ layer will expose the $SiO_2$ substrate 20 in the inter-device areas. This detectable event over the substrate will indicate also that the surface of the intrinsic layer 36 has been exposed.

In the processing sequence of FIG. 5 we disclose a method for fabricating highly desirable self-aligned devices.

Figure 5A:
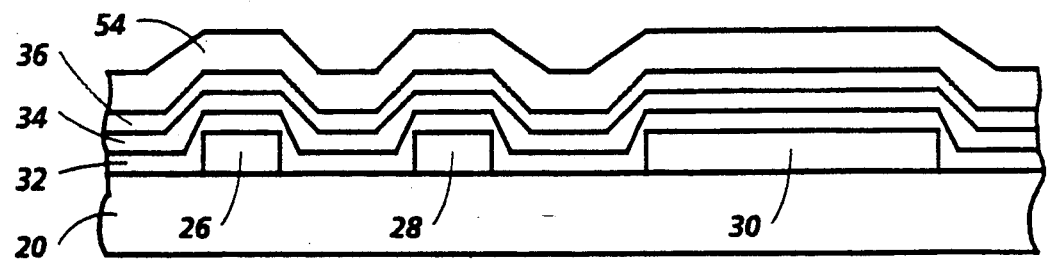
FIGS. 5a through 5f are cross sections, not to scale, showing a process for fabricating a self-aligned form of our invention.

FIG. 5a: This Figure represents the same initial processing steps described above, namely the deposition and patterning of the n+ layer with a feature mask to form the n+ source, drain and gate features 26/28/30 followed by deposition of the tri-layer stack 32/34/36 and a photoresist layer 54.

Figure 5B:
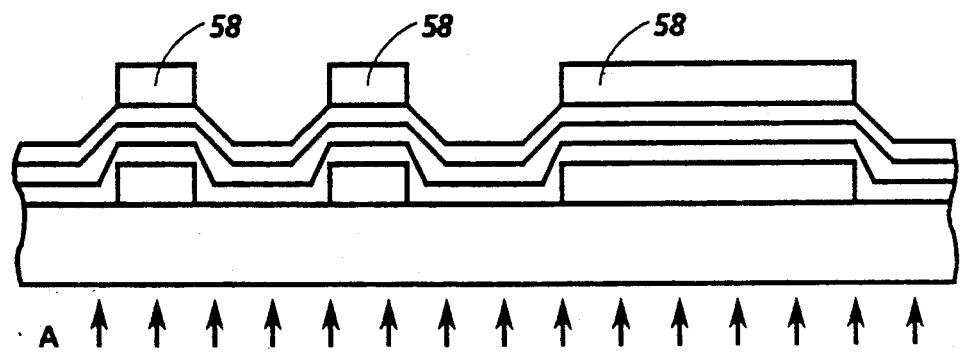

FIG. 5b: A back-side exposure step, indicated by arrows A followed by stripping step for removal of the photoresist in the exposed areas aligns the remaining photoresist 58 with the n+ source, drain and gate features 26/28/30. In order to accomplish back-side exposure successfully, the source, drain and gate features must be sufficiently thick so as to be virtually opaque, while the tri-layer stack should be sufficiently thin so as to pass light to the photoresist layer 54.

Figure 5C:
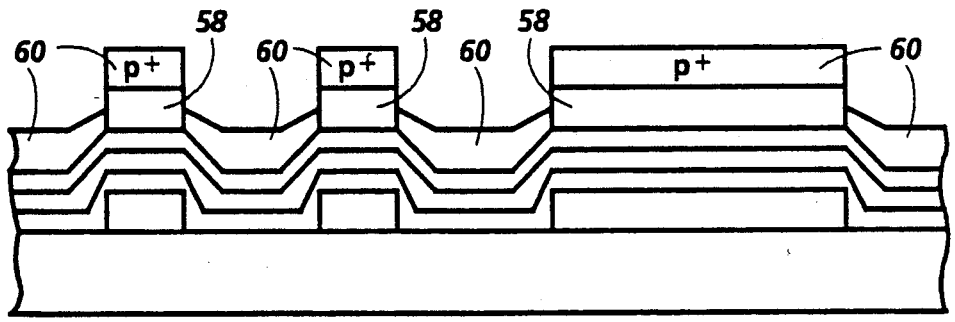

FIG. 5c: A top p+ layer 60 is then deposited over the wafer.

Figure 5D:
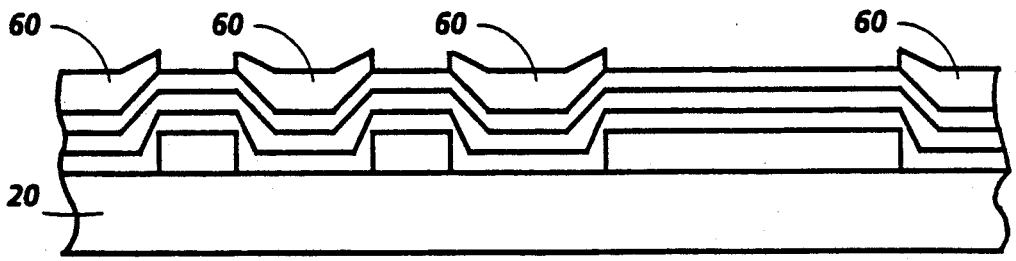

FIG. 5d: Those portions of the p+ layer overlying photoresist areas 58 are removed by the standard lift-off techinque, leaving p+ in the inter-island regions well as in the device feature regions.

Figure 5E:
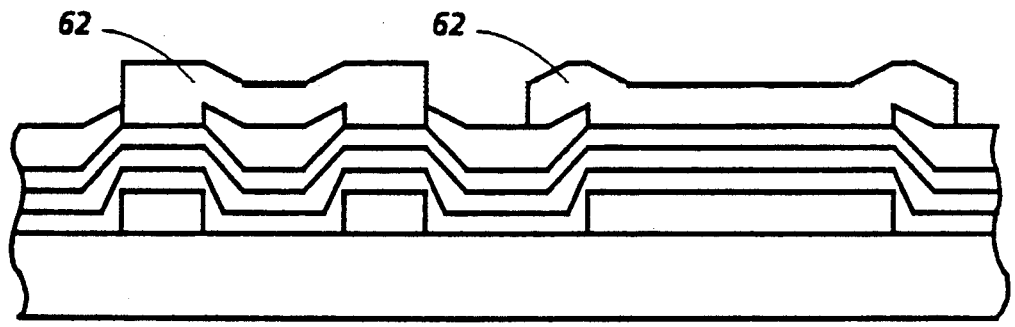

FIG. 5e: Then, a patterned photoresist layer 62 is deposited over the wafer and defined by and island mask.

Figure 5F:
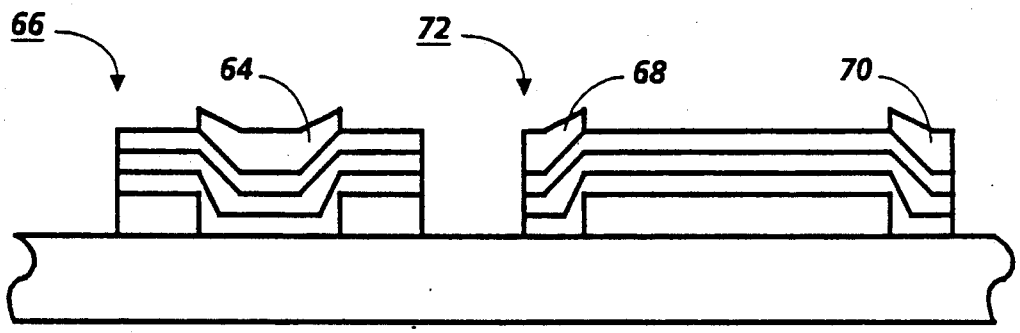

FIG. 5f: Finally, the inter-island p+ regions are away and the photoresist stripped. The resultant p+ gate 64 is in alignment with n+ source 26 and drain 28 of n-channel transistor 66, and the p+ source 68 and p+ drain 70 are in alignment with n+ of p-channel transistor 72. As with the devices of FIGS. 3f and 4e, the remainder of the processing, including the deposition of contact pads and electrical interconnects, can follow that of a standard back-end process to complete the SOI CMOS devices. It should be noted that no second feature mask is required to define the p+ features, since they are formed in alignment with the n+ features.

Figure 6:
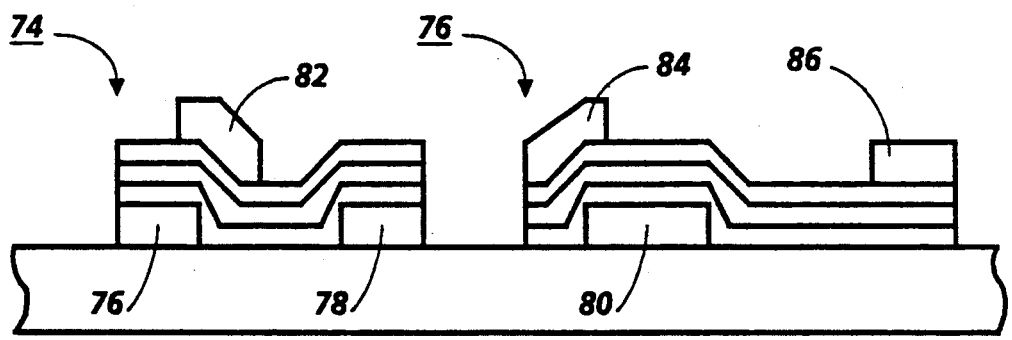
FIG. 6 is a schematic side elevation view of a high voltage SOI CMOS device fabricated in accordance with the principles of our invention.

Another advantage of our process if that it lends itself readily to the formation of high voltage SOI CMOS transistors, one configuration of which is identified as 72 and 74 in FIG. 6. By suitably modifying the first and second feature masks both the n+ gate 80 ans the p+ gate 82 may be formed so that they do not extend completely between their respective oppositely doped source/drain elements, 84/86 and 76/78.

It deserves noting that our SOI CMOS device includes a tri-layer stack intermediate the gate and the source/drain levels. The intrinsic or lightly doped layer lying contiguous to the source and drain elements will serve as the active channel layer, while the intrisic or lightly doped layer lying contiguous to the gate will serve as an extension of the gate. As a result, the threshold voltage of the transistor will be only slightly modified due to the difference in work functions between the intrinsic or lightly doped layer and the gate. For example, the work function difference between n+ doped (or p+ doped) polcrystalline silicon (the gate) and intrinsic polycrystalline silicon(the intrinsic or lightly doped layer) is about half the energy of polycrystalline silicon, or about 0.55–0.7 V.

It should be understood that the present disclosure has been made only by way of example. For example, as we have already stated the order of deposition of the n+ and p+ layers may be readily reversed. Similarly, although the semiconductor meterial we have described has been silicon, other suitable semiconductor materials, such as germanium, alloys of silicon and germanium, alloys of silicon and carbon, or other material may be used. Other changes in fabrication steps may be resorted to, without departing from ther true spirit and scope of our invention as hereinafter claimed.

What is claimed:

1. A method of fabricating a thin film SOI CMOS device comprising the steps of providing an insulating substrate, depositing a first doped semiconductor layer upon said substrate and patterning it to form simultaneously the source and drain elements of one transistor and the gate element of its complementary transistor, depositing a tri-layer stack over said patterned first layer, said stack comprising a pair of intrinsic or lightly doped semiconductor layers separated by a dielectric layer, depositing a second doped semiconductor layer upon said tri-layer stack and patterning it to form simultaneously the gate source and drain element of said one transistor and the source and drain elements of said complementary transistor, and isolating said transistors into islands by removing any portion of said layers extending between said transistors.

2. The method of fabricating a thin film SOI CMOS device as defined in claim 1 wherein said step of patterning said second doped semiconductor layer includes the step of illuminating through said substrate so that said source, drain and gate elements in said second doped semiconductor layer are aligned with said source, drain and gate elements of said first doped semiconductor layer.

* * * * *